US010722997B2

(12) United States Patent
West et al.

(10) Patent No.: US 10,722,997 B2
(45) Date of Patent: Jul. 28, 2020

(54) MULTILAYER POLISHING PADS MADE BY THE METHODS FOR CENTRIFUGAL CASTING OF POLYMER POLISH PADS

(71) Applicant: Thomas West, Inc., Sunnyvale, CA (US)

(72) Inventors: Thomas West, Portola Valley, CA (US); Long Nguyen, San Jose, CA (US); Gary Quigley, Loomis, CA (US); Pepito Galvez, San Jose, CA (US); Koli Holani, Sunnyvale, CA (US); Kevin Song, San Jose, CA (US); Jorge Craik, San Jose, CA (US); Matt Richardson, Milpitas, CA (US); Peter McKeever, Redwood City, CA (US)

(73) Assignee: Thomas West, Inc., Sunnyvale, CA (US)

( * ) Notice: Subject to any disclaimer, the term of this patent is extended or adjusted under 35 U.S.C. 154(b) by 0 days.

(21) Appl. No.: 14/297,177

(22) Filed: Jun. 5, 2014

(65) Prior Publication Data
US 2014/0287663 A1    Sep. 25, 2014

Related U.S. Application Data

(63) Continuation-in-part of application No. 13/854,856, filed on Apr. 1, 2013.
(Continued)

(51) Int. Cl.
*B24B 37/22* (2012.01)
*B24B 37/26* (2012.01)
(Continued)

(52) U.S. Cl.
CPC .............. *B24B 37/22* (2013.01); *B24B 37/26* (2013.01); *B24D 11/003* (2013.01); *B24D 18/00* (2013.01);
(Continued)

(58) Field of Classification Search
CPC ...... B24D 3/28; B24D 11/003; B24D 11/005; B24D 18/009; B29C 41/04; B29C 41/042;
(Continued)

(56) References Cited

U.S. PATENT DOCUMENTS 2,870,054 A    12/1899  Amos et al.
3,253,070 A    12/1899  Gerson et al.
(Continued)

FOREIGN PATENT DOCUMENTS

CN    1460055 A    12/2003
CN    1675063 A     9/2005
(Continued)

OTHER PUBLICATIONS

International Search Report and Written Opinion dated Jul. 9, 2013 in PCT App # US2013/034858.
(Continued)

*Primary Examiner* — Monica S Carter
*Assistant Examiner* — Marcel T Dion
(74) *Attorney, Agent, or Firm* — Carr & Ferrell LLP

(57) ABSTRACT

A method for making a multilayer polishing pad includes rotating a cylinder about a central axis. The cylinder encloses in an interior space a single polymer mixture that phase separates under centrifugal force. The method also includes forming the polishing pad from at least some of a polymer formed after the polymer mixture has reacted. The method includes forming at least two distinct layers in the polishing pad by casting and gelling sequentially at least two different polymers.

24 Claims, 11 Drawing Sheets

Related U.S. Application Data

(60) Provisional application No. 61/619,328, filed on Apr. 2, 2012, provisional application No. 61/942,457, filed on Feb. 20, 2014.

(51) Int. Cl.
*B24D 11/00* (2006.01)
*B29C 41/04* (2006.01)
*B24D 18/00* (2006.01)
*H01L 21/67* (2006.01)

(52) U.S. Cl.
CPC ...... *B29C 41/047* (2013.01); *H01L 21/67046* (2013.01)

(58) Field of Classification Search
CPC ..... B29C 41/047; B29C 41/32; B29C 41/265; B24B 37/22; B24B 37/24; B24B 37/26
USPC ..................................... 451/527, 532, 533
See application file for complete search history.

(56) References Cited

U.S. PATENT DOCUMENTS

| | | | |
|---|---|---|---|
| 4,762,751 A | 8/1988 | Girgis et al. | |
| 4,808,364 A | 2/1989 | Blunt et al. | |
| 5,039,297 A | 8/1991 | Masters | |
| 5,681,612 A * | 10/1997 | Benedict | B24D 3/28 427/202 |
| 5,713,120 A * | 2/1998 | Watabe | B29C 41/042 264/311 |
| 6,171,181 B1 | 1/2001 | Roberts et al. | |
| 6,267,917 B1 * | 7/2001 | Guzikowski | B29C 33/30 264/297.6 |
| H001987 H | 8/2001 | Brink et al. | |
| 6,392,206 B1 | 5/2002 | Von Arx et al. | |
| 6,406,363 B1 | 6/2002 | Xu et al. | |
| 6,422,921 B1 * | 7/2002 | Ettinger | B24B 37/22 451/285 |
| 6,641,471 B1 | 11/2003 | Pinheiro et al. | |
| 6,752,690 B1 * | 6/2004 | Fruitman | 451/6 |
| 6,857,941 B2 * | 2/2005 | Emami | B24D 7/14 451/285 |
| 6,884,156 B2 | 4/2005 | Prasad et al. | |
| 6,905,402 B2 * | 6/2005 | Allison | B24B 37/24 451/28 |
| 7,275,928 B2 | 10/2007 | Kolesar et al. | |
| 7,414,080 B2 | 8/2008 | Kulp | |
| 8,257,545 B2 | 9/2012 | Loyack et al. | |
| 9,156,124 B2 | 10/2015 | Allison et al. | |
| 10,022,842 B2 | 7/2018 | West et al. | |
| 2002/0068513 A1 | 6/2002 | Xu et al. | |
| 2002/0081946 A1 | 6/2002 | Scott et al. | |
| 2002/0084547 A1 * | 7/2002 | Naus | B29C 41/042 264/104 |
| 2003/0090024 A1 * | 5/2003 | Skov | B29C 33/44 264/157 |
| 2003/0181155 A1 | 9/2003 | West et al. | |
| 2004/0005423 A1 * | 1/2004 | Dalton | B29C 39/006 428/36.9 |
| 2004/0023737 A1 | 2/2004 | Fair | |
| 2004/0023767 A1 * | 2/2004 | Kato et al. | 492/59 |
| 2004/0055223 A1 | 3/2004 | Ono et al. | |
| 2004/0096608 A1 * | 5/2004 | King et al. | 428/35.7 |
| 2004/0113322 A1 | 6/2004 | Grimmer et al. | |
| 2004/0134792 A1 * | 7/2004 | Butterfield et al. | 205/640 |
| 2004/0149733 A1 | 8/2004 | Abbott et al. | |
| 2004/0224611 A1 | 11/2004 | Aoi et al. | |
| 2004/0248508 A1 * | 12/2004 | Lombardo et al. | 451/537 |
| 2004/0259484 A1 * | 12/2004 | Prasad | B24B 37/205 451/287 |
| 2005/0107007 A1 | 5/2005 | Furukawa et al. | |
| 2005/0129921 A1 | 6/2005 | Laws et al. | |
| 2005/0136206 A1 | 6/2005 | Cormier et al. | |
| 2005/0171224 A1 * | 8/2005 | Kulp | B24B 37/24 521/155 |
| 2005/0197050 A1 * | 9/2005 | Prasad | B24B 37/205 451/41 |
| 2005/0218548 A1 * | 10/2005 | Preston et al. | 264/50 |
| 2006/0052040 A1 | 3/2006 | Prasad | |
| 2006/0088622 A1 | 4/2006 | Persico | |
| 2007/0066195 A1 * | 3/2007 | Duong | B24B 37/24 451/526 |
| 2007/0141312 A1 * | 6/2007 | James | B24B 37/22 428/212 |
| 2007/0144074 A1 * | 6/2007 | Petersen | B24D 11/02 51/295 |
| 2007/0275229 A1 * | 11/2007 | Laws | B29C 41/04 428/318.8 |
| 2008/0207100 A1 * | 8/2008 | Roy et al. | 451/529 |
| 2008/0241455 A1 | 10/2008 | DiNello et al. | |
| 2008/0274674 A1 * | 11/2008 | Prasad et al. | 451/60 |
| 2008/0291771 A1 | 11/2008 | Khouri et al. | |
| 2009/0043398 A1 * | 2/2009 | Yakimicki | B29C 41/06 623/23.51 |
| 2009/0075568 A1 | 3/2009 | Kimura et al. | |
| 2010/0001425 A1 | 1/2010 | Pop-Iliev et al. | |
| 2010/0063172 A1 * | 3/2010 | Negle | B29C 39/006 521/142 |
| 2010/0087128 A1 | 4/2010 | Nakayama et al. | |
| 2010/0112919 A1 | 5/2010 | Bonner et al. | |
| 2010/0175810 A1 | 7/2010 | Korwin-Edson et al. | |
| 2010/0178414 A1 * | 7/2010 | Judge | A61F 2/12 427/2.24 |
| 2011/0021123 A1 | 1/2011 | Kulp et al. | |
| 2011/0038975 A1 | 2/2011 | Park et al. | |
| 2011/0070005 A1 | 3/2011 | Mizumo | |
| 2011/0159793 A1 * | 6/2011 | Pai et al. | 451/442 |
| 2011/0221089 A1 | 9/2011 | Pop-Iliev et al. | |
| 2011/0265515 A1 | 11/2011 | Hernandez Delsol et al. | |
| 2012/0302148 A1 | 11/2012 | Bajaj et al. | |
| 2012/0315830 A1 * | 12/2012 | Joseph | B24B 37/26 451/59 |
| 2013/0260657 A1 | 10/2013 | West et al. | |
| 2015/0231766 A1 | 8/2015 | West et al. | |
| 2017/0203411 A9 | 7/2017 | West et al. | |
| 2018/0036919 A1 * | 2/2018 | Zhang | B29C 41/003 |
| 2018/0311791 A1 | 11/2018 | West et al. | |

FOREIGN PATENT DOCUMENTS

| | | |
|---|---|---|
| CN | 101106905 A | 1/2008 |
| JP | 200042901 A | 2/2000 |
| JP | 2001-277304 | 10/2001 |
| JP | 2003-001565 | 1/2003 |
| JP | 2005322790 A | 11/2005 |
| KR | 10-0771562 | 10/2007 |
| KR | 10-2010-0041160 | 4/2010 |
| KR | 10-2010-0096718 | 9/2010 |
| KR | 101021783 B1 | 3/2011 |
| KR | 1020150002734 A | 1/2015 |
| KR | 1020160124208 | 10/2016 |
| KR | 102100654 B1 | 4/2020 |
| SG | 11201610107 T | 3/2019 |
| TW | 340082 | 9/1998 |
| TW | 200505635 A | 2/2005 |
| TW | 200530382 A | 9/2005 |
| TW | I295949 B | 4/2008 |
| TW | I311512 B | 7/2009 |
| TW | 200946279 A | 11/2009 |
| TW | 201121710 A | 7/2011 |
| TW | I359718 B | 3/2012 |
| TW | 102111787 | 1/2014 |
| TW | 201402275 A | 1/2014 |
| TW | 201534430 A | 9/2015 |
| TW | 201607643 A | 3/2016 |
| TW | I647066 B | 1/2019 |
| TW | I665033 | 7/2019 |
| TW | I671161 | 9/2019 |
| WO | 2013151946 | 10/2013 |

(56) References Cited

FOREIGN PATENT DOCUMENTS

WO      WO2015127077 A1    8/2015
WO      WO2015187338 A1   12/2015

OTHER PUBLICATIONS

Patent Cooperation Treaty Application No. PCT/US2013/034858, "International Search Report" and "Written Opinion" dated Jul. 9, 2013.
Patent Cooperation Treaty Application No. PCT/US2015/016615, "International Search Report" and "Written Opinion" dated May 20, 2015.
Patent Cooperation Treaty Application No. PCT/US2015/030903, "International Search Report" and "Written Opinion" dated Sep. 4, 2015.
Singapore Patent Application No. 11201406287Q, "Office Action," dated Nov. 2, 2015.
Taiwan Patent Application No. 104105866, "Notice of Request for Submission of Argument," Oct. 3, 2016, 8 pages [12 pages including translation].
Non-Final Office Action, dated Jul. 29, 2015, U.S. Appl. No. 13/854,856, filed Apr. 1, 2013.
Final Office Action, dated Mar. 25, 2016, U.S. Appl. No. 13/854,856, filed Apr. 1, 2013.
Non-Final Office Action, dated Jul. 25, 2016, U.S. Appl. No. 13/854,856, filed Apr. 1, 2013.
Non-Final Office Action, dated Oct. 5, 2016, U.S. Appl. No. 14/626,256, filed Feb. 19, 2015.
Taiwan Patent Application No. 102111787, "Office Action," Jan. 11, 2017, 22 pages.
"Office Action," Taiwan Patent Application No. 104105866, dated May 17, 2017, 5 pages [8 pages including translation].
Advisory Action, dated Apr. 14, 2017, U.S. Appl. No. 13/854,856, filed Apr. 1, 2013.
Final Office Action, dated Jun. 19, 2017, U.S. Appl. No. 14/626,256, filed Feb. 19, 2015.
Non-Final Office Action, dated Jul. 20, 2017, U.S. Appl. No. 13/854,856, filed Apr. 1, 2013.
"Office Action," Singapore Patent Application No. 11201606734R, dated Jul. 11, 2017, 7 pages.
"Office Action," Taiwan Patent Application No. 102111787, dated Dec. 11, 2017, 6 pages [15 pages including translation].
"Office Action," Singapore Patent Application No. 11201610107T, dated Dec. 14, 2017, 6 pages.
"Search Report," Singapore Patent Application No. 10201608125W, dated Apr. 9, 2018, 5 pages.
"Office Action," Singapore Patent Application No. 10201608125W, dated Dec. 12, 2019, 5 pages.
"Office Action," Taiwan Patent Application No. 104117524, dated Sep. 3, 2018, 16 pages [21 pages including translation].
"Notice of Allowance," Taiwan Patent Application No. 104105866, dated Nov. 2, 2018, 3 pages.
"Notice of Allowance," Singapore Patent Application No. 11201610107T, Dec. 6, 2018, 6 pages.
"Notice of Allowance," Taiwan Patent Application No. 104117524, Mar. 22, 2019, 3 pages.
"Notice of Allowance," Taiwan Patent Application No. 102111787, May 23, 2019, 3 pages.
"Office Action," Korean Patent Application No. 10-2014-7030712, May 3, 2019, 10 pages [20 pages including translation].
"Office Action," Singapore Patent Application No. 10201807026V, Aug. 2, 2019, 9 pages.
"Notice of Allowance," Korean Patent Application No. 10-2014-7030712, dated Mar. 18, 2020, 3 pages [4 pages including translation].

\* cited by examiner

MULTILAYER POLISHING PADS MADE BY THE METHODS FOR CENTRIFUGAL CASTING OF POLYMER POLISH PADS

CROSS-REFERENCE TO RELATED APPLICATIONS

This Non-Provisional U.S. Patent Application is a Continuation-In-Part Application of U.S. patent application Ser. No. 13/854,856 filed Apr. 1, 2013, entitled "Methods and Systems for Centrifugal Casting of Polymer Polish Pads and Polishing Pads Made by the Methods", which claims the benefit of U.S. Provisional Application No. 61/619,328, filed on Apr. 2, 2012. This Non-Provisional U.S. Patent Application also claims priority to U.S. Provisional Application No. 61/942,457, filed on Feb. 20, 2014. All of the aforementioned disclosures are incorporated by reference herein by reference in their entirety for all purposes.

FIELD

The present disclosure relates generally to polishing pads. More specifically, the present disclosure relates to methods and systems for casting polymer polishing pads using a centrifugal caster.

BACKGROUND

Polishing (also referred to as planarizing) is a process step which is commonly used in the manufacture of semiconductor, hard disk drive and optical products. The polishing process generally consists of rubbing a substrate against a polymer pad, or vice versa. A chemical solution, usually containing fine particles (the slurry), is present at the interface between the substrate and the polymer pad.

SUMMARY OF THE DISCLOSURE

A method is provided that includes rotating a mold about an axis. The mold confines a polymer mixture that includes at least a high density material and a low density material. The method also includes separating the polymer mixture under an influence of a centrifugal force into a first layer that includes the high density material and a second layer that includes the low density material. The mold includes a cylinder, and the axis is a central axis of the cylinder. In some embodiments, the cylinder includes a centrifugal caster adapted to rotate. The centrifugal caster defines a cylindrical interior space.

The method optionally includes forming a multilayer polishing pad that includes at least two distinct layers after the polymer mixture has separated and reacted. The first layer is adapted to be used as a polish pad of the multilayer polishing pad, and the second layer is adapted to be used as a sub-pad of the multilayer polishing pad. The low density material includes microspheres that enclose a gas.

In some embodiments, the method includes introducing a second polymer mixture into the mold and further rotating the mold. The second polymer mixture includes a single density material or at least a second high density material and a second low density material. If the second polymer mixture is a single density material, it may be may be harder, softer, thicker or thinner than either of the first or second layers, individually or combined. The layer formed by the second polymer mixture may act as a polish surface or a sub-pad. The second polymer mixture separates under the influence of the centrifugal force during the further rotating operation into a third layer including the second high density material and a fourth layer including the second low density material. The third layer is interposed between the second layer and the fourth layer. The second low density material includes microspheres that enclose a gas.

In some embodiments, the method includes, before introducing the second polymer mixture into the mold, placing a layer of polyester, textile, or conductive material on the second layer to form an additional layer on top of the second layer. The method may include, before introducing the second polymer mixture into the mold, spraying a liquid onto a surface of the second layer. The liquid is an adhesive and/or a conductive layer. Alternatively, a layer of polyester, textile or a conductive material is placed on the second layer. Prior to this step a liquid may be dispensed onto the surface of the second layer. No additional layers are added.

A dispenser is adapted to introduce the polymer mixture into the centrifugal caster. The method optionally includes heating the mold during at least a portion of a time of the rotating. The method optionally includes treating a surface of the mold with a mold release agent prior to dispensing the polymer mixture into the mold.

In some embodiments, the method includes forming a texture on a surface of the mold and/or using a liner or insert. The liner or insert will contain texture. The liner or insert placed on the surface of the mold is referred to as the bottom liner or insert. In addition, a second liner or insert may be positioned in the mold after the polymer mixture has been applied to the mold and/or bottom liner or insert. This second liner or insert is referred to as the top liner or insert. The texture of the liners or inserts is adapted to form a groove texture on a working surface of the multilayer polishing pad, a perforation delineating an outer edge of the multilayer polishing pad, and/or a roughened texture on a backside of a pad surface opposite the working surface to improve adhesion between the pad surface and an adhesive and/or a sub-pad.

The method includes positioning at least one window on a surface of the mold prior to introducing the polymer mixture into the mold.

A system for manufacturing a multilayer polishing pad is provided. The system includes a mold having a rotational axis. Substantially all points on a bottom surface of the mold are substantially equidistant from the rotational axis throughout a revolution about the rotational axis. The mold is adapted to confine a polymer mixture when the mold is rotating. The system further includes a dispenser adapted to introduce the polymer mixture into the mold.

Optionally, the system includes a mandrel insertable along the central axis for positioning a solid insert on a surface of a top layer of the polymer mixture in the interior space. The solid insert is polyester, textile, conductive material, and/or a top liner for imparting a texture to a surface of the polymer mixture.

The system includes a sprayer for spraying a liquid into an interior of the mold. The liquid is a mold release agent, an adhesive, and/or a conductive layer.

In some embodiments, the system includes a heater for heating the mold during at least a portion of a time of the rotating and reacting of the polymer mixture.

DETAILED DESCRIPTION

Figure 1:
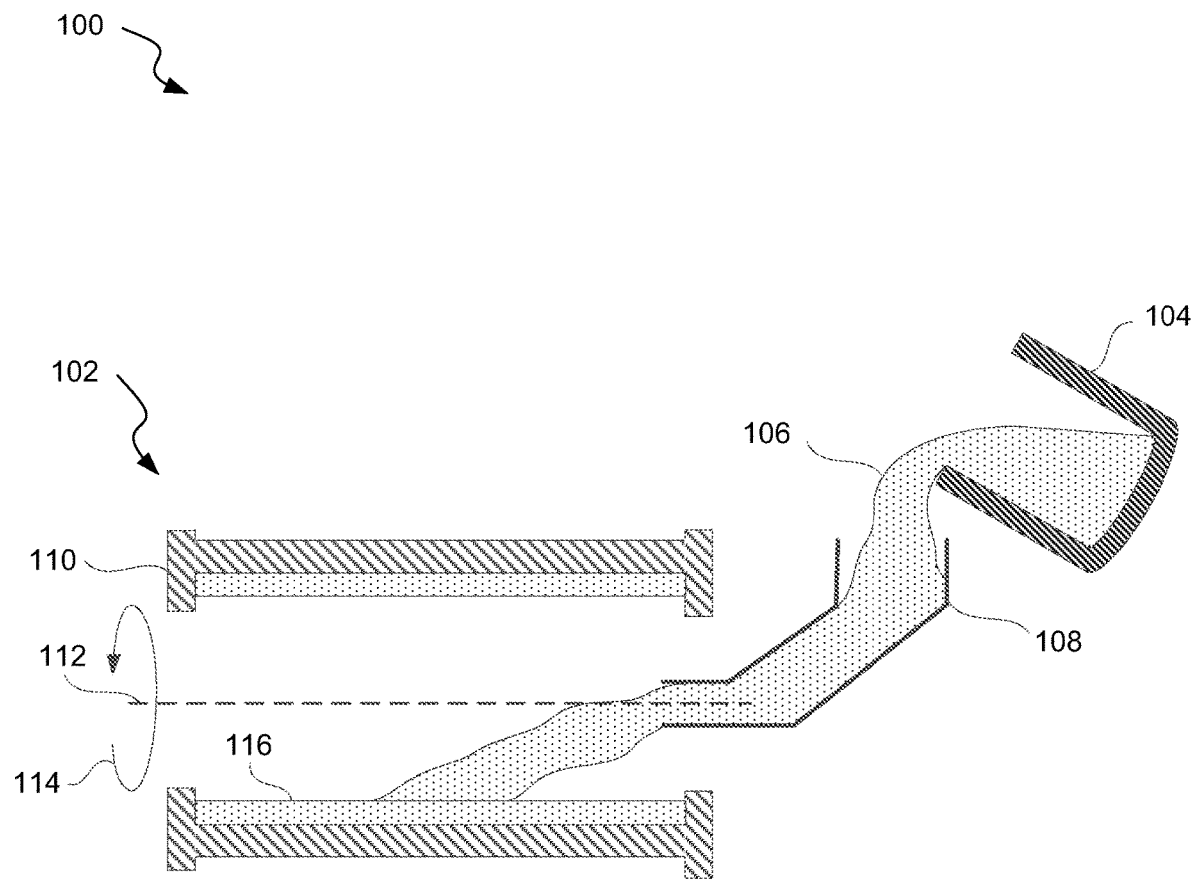
FIG. 1 is a cross section schematic diagram illustrating a centrifugal casting system, according to an example embodiment.

While this disclosure is susceptible of embodiment in many different forms, the disclosure is shown in the drawings and will herein be described in detail several specific embodiments with the understanding that the present disclosure is to be considered as an exemplification of the principles of the disclosure and is not intended to limit the disclosure to the embodiments illustrated. According to example embodiments, the present technology relates generally to polish pads. More specifically, the present disclosure provides a method for making solid multilayer polymer polish pads.

Polishing within the semiconductor industry is referred to as Chemical Mechanical Planarization (CMP). Polymer polish pads used for CMP typically use closed cell polyurethane materials or foamed polyurethanes, while some polish pads used for CMP employ open cell polyurethane materials. Additionally, fiber impregnated with a polymer, or polymers combined with abrasives can be utilized. The surface of such pads may contain a micro texture. The micro texture is to the polish performance of the pad. The micro texture is maintained by the conditioning process. Inconsistencies in this inherent micro structure lead to deviations in the polish performance of the pad. For this reason, pad manufacturers have worked to refine pad manufacturing processes to reduce the variation in their products. In contrast, a solid polymer polish pad contains no inherent micro structure, and instead relies on the conditioning process during use to impart a micro texture to the pad surface. The formulation used for the solid polymer pad is key in terms of compatibility with conventional conditioning processes.

The polymer pad typically includes a single layer solid polymer material or multiple layers of solid polymer material stacked on each other. Alternatively, some non-solid layer(s) may be used. The layers are bonded to each other using adhesive. The layer that polishes is referred to as the polish layer, top pad or pad surface. The top pad material itself is typically based upon polyurethane, though a wide range of other polish pad materials are viable, as described earlier. Flow channels may be provided on the polish surface of the polymer polish pad. These flow channels have many functions but are primarily used to improve slurry flow to ensure the presence of slurry on all areas of the polymer polish pad. The flow channels also result in higher contact pressure during the polishing process which can increase the rate of polish, or planarization, of the substrate. Also, the flow channels can be used to accelerate pad rinsing after the polish step has finished. These flow channels can be considered as macro texture on the polish pad. The macro texture is typically applied prior to use of the polymer polish pad.

During the polish process, or between substrate polishing, a micro texture is formed on the surface of the polymer polish pad. The process of forming such a micro texture is commonly referred to as conditioning. By conditioning the pad surface at such a high frequency, it is possible to maintain a consistent micro texture on the polymer pad surface. This is important to maintain consistent polish performance because the micro texture creates mini flow channels for the slurry between the polymer pad surface and the substrate. During polishing, the afore-mentioned flow channels and the micro texture form a symbiotic relationship in ensuring good fluid dynamics during polishing.

Conditioning of the polymer polish pad is typically performed using a diamond conditioner. Diamond size, shape, density and protrusion level are altered to produce different diamond conditioner capabilities.

Conventional top pad closed cell material manufacturing processes employ one of the following processes: (1) thermoplastic injection molding; (2) thermoset injection molding (often referred to as "reaction injection molding" or "RIM"); (3) thermoplastic or thermoset injection blow molding; (4) compression molding; and (5) a similar process in which a material is positioned and solidified. Such methods are described as using closed cast systems.

Centrifugal casting involves pouring a liquid into a cylindrical mold spinning about its axis of symmetry. The mold is kept rotating until the material has solidified. The present technology provides for the use of a centrifugal caster employed to manufacture polymer polish pads. A centrifugal caster is described as an open cast method.

Centrifugal casting technology is used for manufacturing iron pipes, bushings, wheels, and other parts possessing axial symmetry. In centrifugal casting of metals, a permanent mold is rotated about its axis at high speeds (300 to 3000 RPM) as the molten metal is poured. The molten metal is centrifugally thrown towards the inside mold wall, where it solidifies after cooling. Typical metal materials that can be cast with this process are iron, steel, stainless steels, and alloys of aluminum, copper and nickel.

Centrifugal casting may also be employed for the manufacture of polymer parts. For example, polyurethane timing belts for special applications are produced using centrifugal casting. The belts have special coatings and reinforcing to suit specific transmission applications. The belts are one piece molded and are formed using centrifugal casting process and high performance polyurethane. The belts have embedded steel, Kevlar®, polyester, stainless steel or glass fiber reinforcing. The belts are used with linear drives in applications like packaging, sorting, and assembly machines.

The preparation of the raw materials needed to manufacture a polymer polish pad requires significant control to ensure consistent raw material ratios are input to the mixture. The raw materials need to be heated separately before mixing. In addition, the raw materials preferably are mixed thoroughly to result in even dispersion within the mixture. Depending on the mixing technology in use, the materials may foam upon mixing. The mixture can be passed through a system to eliminate the foam (though this process should not be confused with adding foam to a polymer mixture, as discussed below). The material then needs to be transferred to a mold for reacting. This process can be further complicated when the pot life (i.e., the time until the polymer sets) of the mixture is short. If the pot life is exceeded, then the mixture will begin to gel and may no longer be formed to the desired shape.

The period of time during which a reacting polymeric compound remains suitable for its intended use after having been mixed with a reacting initiating agent is the "pot life". The gel point (or gel time) refers to the stage at which a liquid begins to exhibit pseudo-elastic properties. After a polyurethane has gelled (also referred to as reacted), the material may be solidified sufficiently to be removed from a mold or centrifuge (if any), while still retaining its shape.

For the formation of a solid polymer polish pad, this process has the added concern of preventing the formation of pores in the solid layer. This is particularly difficult when the pot life is short. This often means that use of conventional closed cast systems to make such a solid polymer polish pad comes with many restrictions and in some cases such closed cast systems cannot be used. For example, the material thickness usually needs to be much greater than the allowable polish pad in order to ensure the mixture can fill the cast. This adds economic burden to the pad manufacturing process by increasing waste. The yield of the molding process can be impacted by the tight window of production, and the loss of yield also adds an economic burden to the pad manufacturing process. Inconsistencies can also be seen to develop in the material as a result of the tight window for production.

According to the present technology, a solid polymer polish pad is produced using centrifugal casting. This process involves introducing the polymer mixture, which is a liquid, into a large rotating drum. The centrifugal force propels the polymer mixture against the inner surface of the drum, and when the polymer mixture reacts and becomes solid, a rectangular belt of solid polymer is obtained. When the polymer mixture is introduced into the spinning drum of the centrifugal caster, the polymer mixture material fans out and adheres to the walls of the drum. When the polymer mixture has reacted and solidified, there are substantially no pores across a majority of the material cross section. Any pores present will be isolated to the surface of the sheet, which is opposite or furthest from the interior wall of the drum, and therefore are easily eliminated during formation, preparation and/or conditioning.

Centrifugal casting to make a solid polymer sheet enables the manufacture of a polish pad that is free of voids. In addition, the process can be adjusted to ensure that the total thickness variation (TTV) of the material will be very small. The temperature and speed (in rotations per minute, or RPM) of a centrifugal caster used to make a polish pad can be altered depending on the desired pad characteristics and the type of polymer mixture being used.

The centrifugal casting system and method provided herein allows the formation of a thin sheet of solid polymer with low TTV. A thin sheet of polymer (for example, polyurethane) can be easily converted to a solid polymer polish pad which is absent of voids or pores.

The centrifugal casting method provided herein ensures the formation of a multilayer polish pad with a solid layer and a porous layer with densely packed microspheres using phase separation in a centrifugal casting system. Phase separation can be induced when mixtures contain fillers, abrasives, and/or fibers. The microspheres are typically plastic and vary in size, be expandable or non-expandable, have an enclosed gas or blowing agent, and/or be solid or hollow.

The present technology enables the formation of a multilayer polish pad with different polymer formulations by adding adhesives (e.g., pressure sensitive adhesive) in between the layers. Furthermore, the present technology can be used to induce predetermined or desirable anisotropic chain structure in the polymer sheets.

The porous layer of the polish pad (or sub-pad) is advantageous for polishing because of the compressibility of the material, which comes from the densely packed pores. Additionally, the closed cell pore structure prevents wicking of process fluids into the sub-pad, which may impact polish performance.

An inner surface of the caster is smooth, or alternatively a texture is used to add grooves or channels to a working surface of the polish pad, and/or to improve the performance of the adhesive used in the polish pad construction. Grooves may be added to the polish pad during or after the casing process, and may be made on a surface formed opposite the caster wall. Grooves are useful during use of the polish pad during a CMP operation to promote the flow of slurry. In exemplary embodiments, a pad is formed with multiple layers, and then some or all of these layers are revealed in the groove area through the grooving process. For example, the groove reveals a different structure at the groove bottom, which is distinct from the groove sides and top layer. The newly exposed layer at the bottom of a groove in some cases may be harder, softer, and/or have pores to facilitate slurry flow. Different groove cross-sectional shapes, different layers of materials exposed in the grooves, and/or different groove geometries (for example, spirals or x-y patterns) are utilized to impact the flow of slurry and/or to alter the removal rate for a polish pad.

Heating during centrifugal casting is performed by heating elements that surround or are adjacent to the casting drum, which heat the drum and/or the air in the drum. Typically, the drum is pre-heated prior to introduction of the polymer mixture. Additional processes can also be implemented during the casting operation to improve product performance.

The presence of a micro texture in the pad material enhances the polish performance of the polish pad. Such micro texture should be consistent within the pad material to prevent inconsistent polish performance. A solid pad relies on the micro texture introduced during casting or conditioning. Should a pore or pores be present in the pad material, then this leads to an increased level of polish rate. This increased level of polish rate is in some cases not sustainable because the pores are not consistently present in the layer. For this reason it is important that a solid polish pad contain few or no pores. Efforts to manufacture solid polymer pads without pores have been largely ineffective. By contrast, the use of a centrifugal caster overcomes the issues with polymer mixtures, while ensuring void-free polymer sheets, even with short pot life polymer mixtures. The centrifugal caster reduces or eliminates pores or voids in the polymer sheet because centrifugal force drives the polymer mixture material to the interior wall of the caster, while any pores or voids migrate to the opposite surface since the pores or voids are lighter than the polymer mixture.

During casting, bubbles and/or pores migrate to the surface during hardening of the polymer, and may remain on the surface after hardening. These bubbles and/or pores can be removed by thinning the interior surface of the belt, which is used as the working surface of the polishing pad. This thinning typically requires the removal of between 1 and 4 thousandths of an inch, or alternatively up to $15/1000$ of an inch.

Centrifugal casting of solid polymer sheet provides the unexpected benefit of generating an exceptionally flat polymer sheet. Extreme flatness reduces the requirement for thinning, and consequently avoids loss of stock and the time and expense of thinning. Additionally, the technique reduces or eliminates pores in the polymer cast because the polymer mixture migrates to the drum surface due to the centrifugal force, while the pores don't migrate and consequently are pressed out of the polymer mixture. The substantial absence of pores provides a consistent polishing pad (also referred to as a CMP pad, though alternative polishing applications are encompassed by this disclosure) from initial use to final use. A polishing pad is typically eighty thousandths of an inch thick or thinner, and as the pad is used it gets thinner due to the conditioning process and due to wear during use.

The polymer polish pad formed by centrifugal casting is substantially or completely free of pores or voids, and is substantially uniform in thickness. A polymer sheet is formed using a short pot life mixture, while also being substantially or completely free of pores. Consequently, a high manufacturing throughput is achieved utilizing the present technology Conventional CMP pad manufacturing may include the formation of a cake or ingot of solid polymer that is sliced, which requires substantial uniformity from top to bottom, which is difficult. In contrast, in an example method according to the present technology using centrifugal casting, the solid polymer produced is extremely flat and only a bare minimum thicker than the ultimate thickness of the pad. A very large belt is produced that can be used to make many top pads (or sub-pads) by cutting or punching by any appropriate method, which enables a high throughput along with a very consistent product and substantially non-existent porosity.

The example method disclosed herein is utilized to form two or more separate and distinct layers by casting and gelling sequentially two or more different polymer mixtures. This embodiment is not possible in closed cast systems.

A reinforced pad may be formed using the present technology by placing a fiber network on the partially reacted initial polymer sheet and subsequently forming an additional layer on top of the network. Optimization of centrifugal caster settings allied with polymer mixture formulation allows for the formation of anisotropic polymer sheets. When using solid polymer polish pads, this offers the benefit of a more consistent chain structure orientation. This can enable more consistent micro texture formation with the pad conditioner. The transmission properties of the polymer sheet can be aided with this more regular structure.

An example variation of the present technology utilizes improved adhesion between adhesive (pressure sensitive adhesive or hot melt adhesive) and polymer pad by making the drum interior slightly rough. Poor adhesion can result in pad delamination during polishing. This will result in damage to the polisher, scrap of the substrate being polished and significant downtime for the polisher, which will impact efficiency.

FIG. 1 is a schematic diagram illustrating spin casting system 100 including centrifugal caster 102 and polymer dispenser 104. Polymer dispenser 104 contains polymer mixture 106. Polymer dispenser 104 includes a mixing apparatus and includes jackets, with or without heating elements having conduits for heated fluid to flow through, and/or electrical heating elements. Polymer mixture 106 is a polymer mixture that will phase separate into multiple layers only under centrifugal force and will not phase separate under ambient, non-pressurized conditions. Polymer mixture 106 may be one polyurethane mixture with microspheres added in to change the density of the mixture. Alternatively, polymer mixture 106 contains more than one polymer and includes a polymer composite created within centrifugal caster 102 by adding foam in between the polymer mixtures. The term foam in the context of polishing pads means a polyurethane (also referred to as a PU) pad that has a closed cell or open cell structure. The cells could be microspheres surrounded by PU, voids surrounded by PU or open voids through the PU. A porous pad material is referred to as a foamed pad. Two methods for making a foam product other than by adding microspheres are 1) adding a blowing agent to the polyurethane mixture, and 2) introducing a gas into the mixture (for example, $N_2$ or $CO_2$).

Polymer mixture 106 is streamed from polymer dispenser 104 into pouring path 108 that directs polymer mixture 106 into drum 110 of centrifugal caster 102 while drum 110 is spinning around axis 112 in rotational direction 114. Polymer mixture 106 spreads out to form polymer sheet 116 on an interior surface of drum 110 due to centrifugal force. In the case of drum 110, polymer sheet 116 is cylindrical in shape. Drum 110 spins, and has a diameter such that at whatever rotational velocity drum 110 turns, the centrifugal force experienced by polymer mixture 106 after introduction into drum 110 is sufficient to create a uniform thickness of polymer sheet 116, and to additionally cause phase separation. Phase separation occurs under centrifugal force and causes polymer mixture 106 to separate into at least two layers of polymer, and/or a pure polymer layer and a polymer layer infused with microspheres.

In some embodiments, drum 110 is heated. Drum 110 may have a smooth interior drum face, or alternatively drum 110 has a textured drum face that improves the performance of adhesives used in the polishing pad, that provides grooves to a surface of a polish pad made according to the method, and/or that facilitates the separation and/or forming of a polish pad from a reacted and casted polymer sheet formed by the method.

Figure 2:
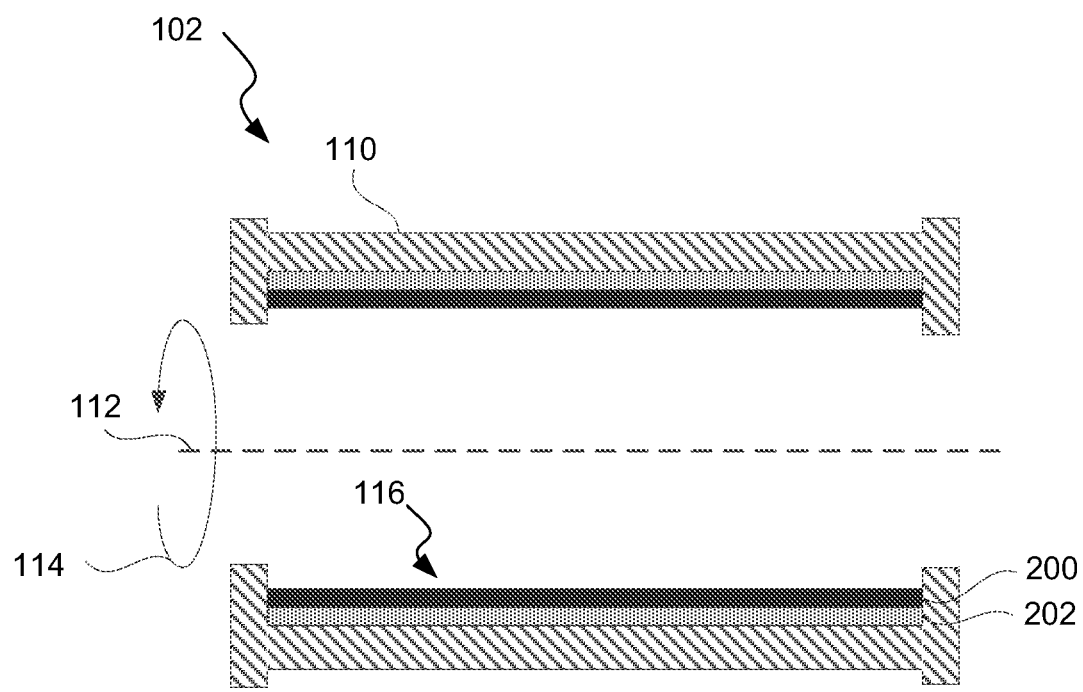
FIG. 2 is a cross section schematic diagram illustrating the centrifugal caster shown in FIG. 1 after an example polymer mixture has undergone phase separation and formed two distinct layers, according to an example embodiment.

FIG. 2 is a schematic diagram illustrating centrifugal caster 102 after polymer mixture 106 has undergone phase separation and formed two distinct layers. After undergoing the centrifugal force in drum 110, polymer mixture 106 phase separates into two distinct layers: soft polymer layer 200 and dense polymer layer 202. During phase separation, the centrifugal force, forces the polymer towards one side of polymer sheet 116, and causing the microspheres to rise to a surface of polymer sheet 116 since they are less dense than the polymer. This phase separations creates a denser layer and a porous layer. Dense polymer layer 202 is the denser layer and forms the hard pad of the polishing pad. Dense polymer layer 202 is a layer of solid polyurethane. Soft polymer layer 200 is the porous layer filled with densely packed microspheres and forms the sub-pad of the polishing pad. Dense polymer layer 202 is the inner layer that interfaces with the interior of drum 110.

Polymer sheet 116 may be thinned either before or after forming an outline of the polymer pad to make a groove pattern on the surface of polymer sheet 116. Similarly, the surface of polymer sheet 116 is conditioned to form a scratch pattern on the polymer pad.

In an embodiment, after dense polymer layer 202 and soft polymer layer 200 of polymer sheet 116 have formed, a third layer of the same or different polymer or another material is cast on top of polymer sheet 116 in order to make a three (or more) layer polymer pad. Subsequent layers are formed, if necessary, by adding the same or different polymer layers as described.

Figure 3:
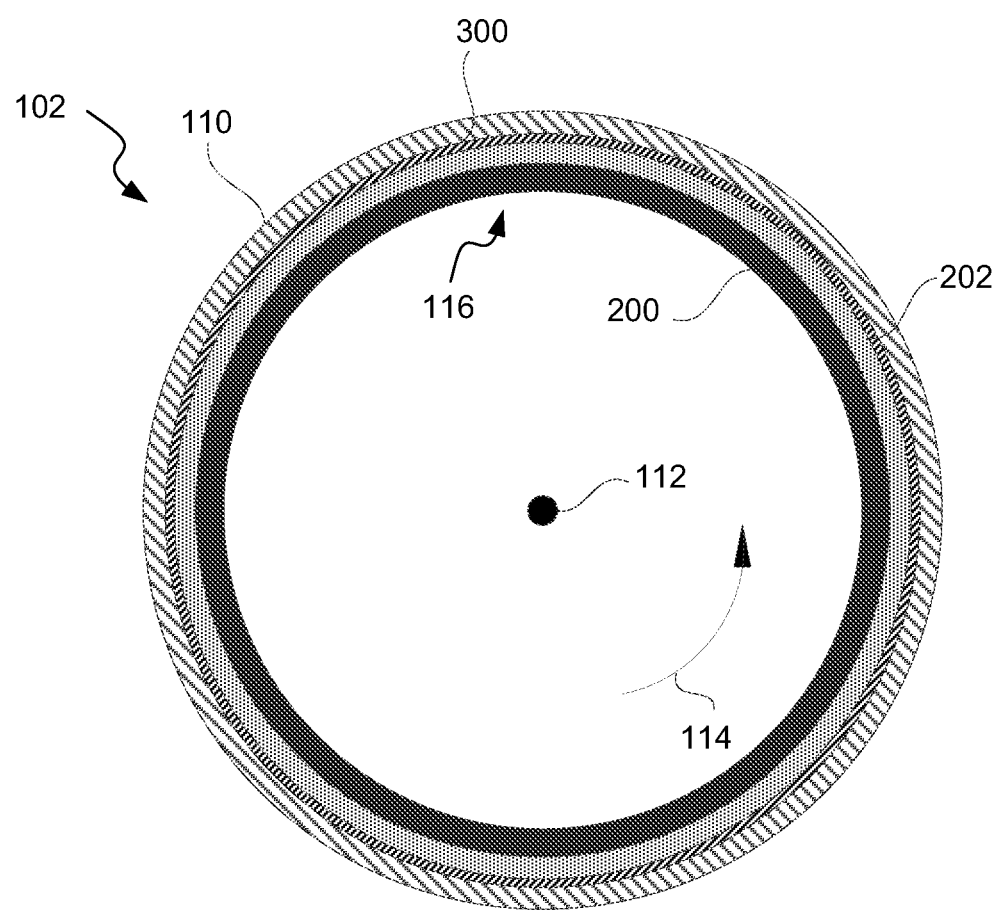
FIG. 3 is a schematic diagram illustrating a cross section of the example centrifugal caster shown in FIG. 2 and showing an example bottom liner or insert and polyurethane casting, according to an example embodiment.

FIG. 3 is a schematic diagram illustrating a cross section of centrifugal caster 102 and showing insert 300 and polymer sheet 116 with dense polymer layer 202 and soft polymer layer 200. Drum 110 spins around axis 112 in rotational direction 114. Insert 300 lines the interior wall of the drum 110. In an embodiment, insert 300 is a mold release agent that is a permanent (e.g., Teflon®), semi-permanent (e.g., Teflon® spray), or temporary coating in the centrifugal caster 102 that facilitates release of the solid polymer after casting. In particular, the interior surface of drum 110 is in some cases sprayed with a Teflon® coating after a certain number of castings, for example after 20 castings. Alternatively, insert 300 is a mold release sheet made from High-density polyethylene (HDPE), Thermoplastic, Polytetrafluoroethylene (PTFE) or Silicone. In certain instances, insert 300 is replaced infrequently, for example once every few months.

In another embodiment, insert 300 is grooved to form groove patterns on the surface of polymer sheet 116, which are formed on dense polymer layer 202. In further embodiments, insert 300 has channels for the purpose of forming different types of polishing pads.

Figure 4:
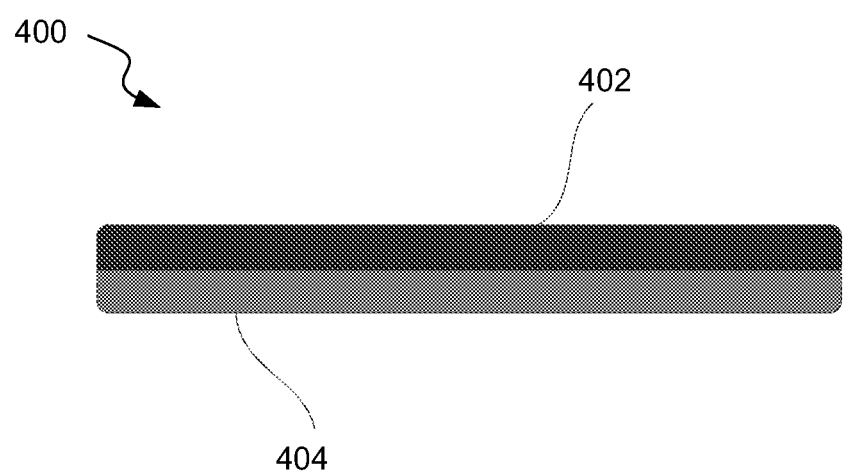
FIG. 4 is a schematic diagram illustrating a cross section of an example multi-layer polymer pad, according to an example embodiment.

FIG. 4 is a schematic diagram illustrating a cross section of polymer pad 400. After dense polymer layer 202 and soft polymer layer 200 have formed, drum 110 is stopped and polymer sheet 116 containing the two layers is removed from drum 110. Removing polymer sheet 116 includes cutting polymer sheet 116 along a line parallel to axis 112, causing polymer sheet 116 to change from a cylindrical belt shape to a rectangular shape. Alternatively, the cutting process may be performed external to the centrifugal caster. Polymer pad 400 is cut out or punched out of polymer sheet 116. The removed polymer pad 400 includes sub-pad 402 and hard pad 404. Hard pad 404 is formed from dense polymer layer 202 while sub-pad 402 is formed from soft polymer layer 200. Both hard pad 404 and sub-pad 402 can be used for polishing. Although the solid side (hard pad 404) is conventionally used for polishing, the porous side (sub-pad 402, though for this use it would not be a sub-pad) may be used and provides uniform polishing due to the dense packing of microspheres. Sub-pad 402 has pores that are packed extremely tight allowing for more compressibility, and also prevents wicking. Before or after forming an outline of the polymer pads, the surfaces of polymer sheet 116 are thinned to create a more uniform thickness on both layers and/or to remove surface imperfections. Additionally, a sub-pad may be added on either side of this assembly, before or after forming an outline and/or thinning.

Figure 5:
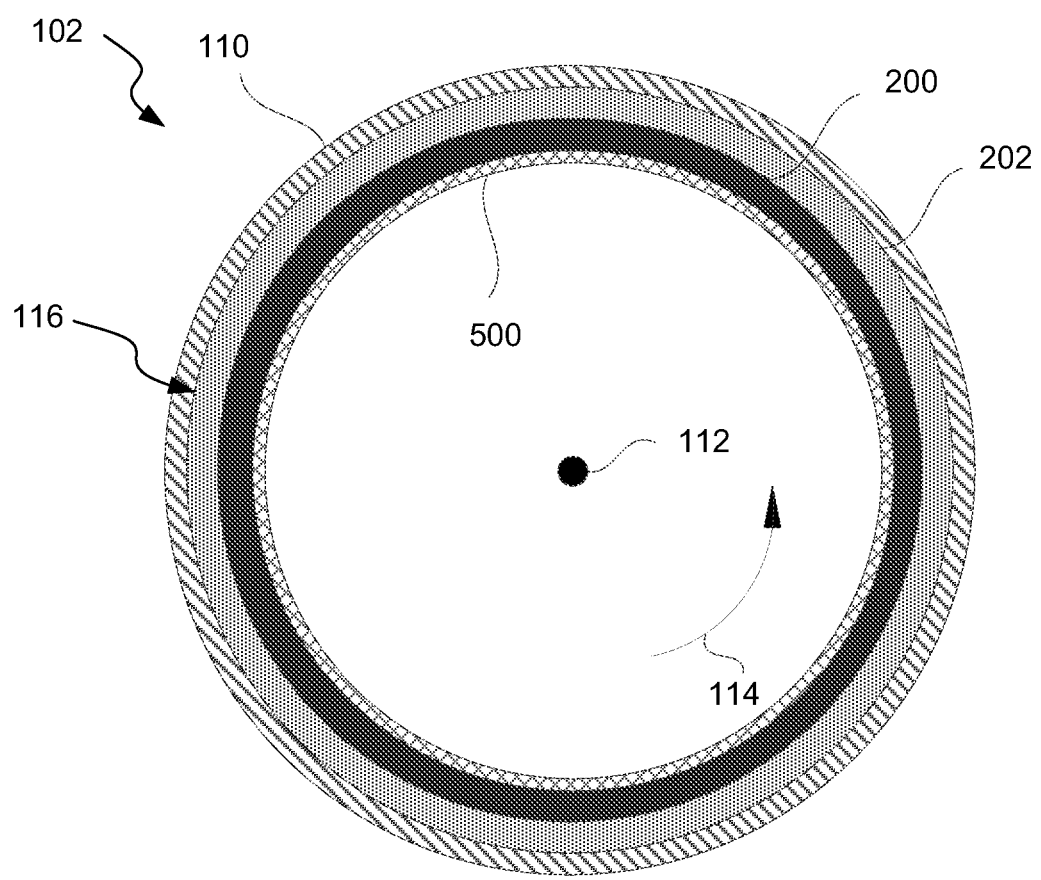
FIG. 5 is a schematic diagram illustrating a cross section of the example centrifugal caster and showing a top liner or insert and polyurethane casting, according to an example embodiment.

FIG. 5 is a schematic diagram illustrating a cross section of centrifugal caster 102 and showing internal insert 500 and polymer sheet 116 with dense polymer layer 202 and soft polymer layer 200. Internal insert 500 is a sheet made from HDPE, Thermoplastic, PTFE or Silicone and has groove patterns similar to insert 300. Internal insert 500 lays against polymer sheet 116 and is placed within drum 110 by hand or with the use of a mandrel.

Figure 5A:
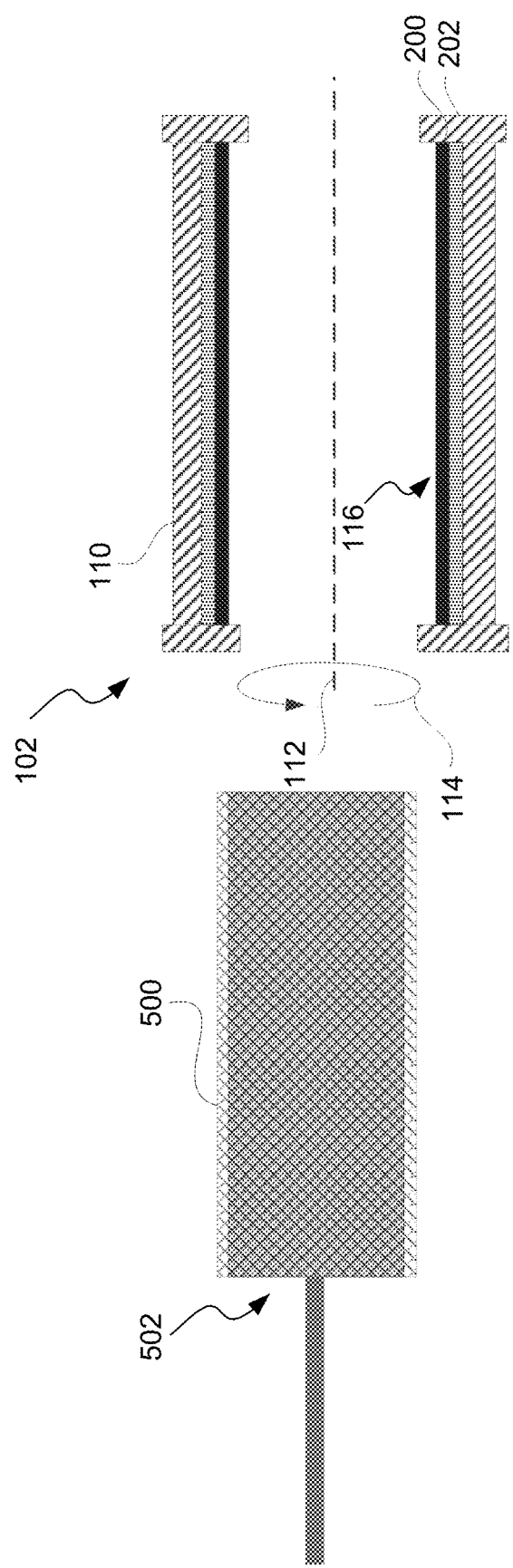
FIG. 5A is a cross section schematic diagram illustrating a mandrel used to place the top liner or insert into the centrifugal caster shown in FIG. 5, according to an example embodiment.

With a mandrel 502 internal insert 500 is wrapped around mandrel 502 to ease the placement in drum 110 as depicted in the cross section schematic diagram of FIG. 5A. In particular, drum 110 is slowed to a lower RPM while the mandrel with internal insert 500, rotating at the same RPM as drum 110, is inserted into the center of drum 110 along axis 112. The RPM of drum 110 is increased back to the original rotational speed, creating a strong enough centrifugal force that pulls internal insert 500 from the mandrel towards polymer sheet 116.

Figure 6:
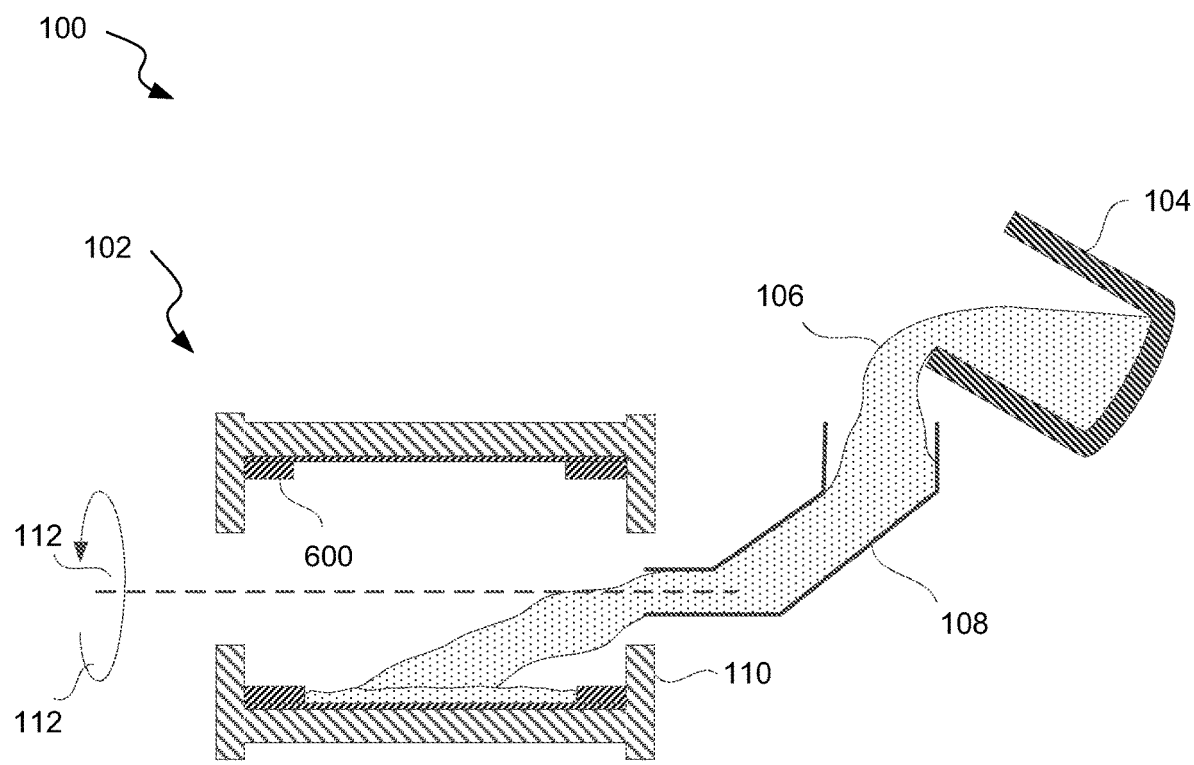
FIG. 6 is a cross section schematic diagram illustrating the centrifugal casting system with an example mold insert lining the interior wall (bottom liner/insert) of an example drum of the example centrifugal caster, according to an example embodiment.

FIG. 6 is a schematic diagram illustrating spin casting system 100 with mold insert 600 lining the interior wall of drum 110 of centrifugal caster 102. Mold insert 600 be a sheet made from Teflon®, HDPE, Thermoplastic, PTFE or Silicone lining the interior wall of drum 110. Mold insert 600 has at least one mold of a polishing pad, with the number of molds depending on the size of drum 110 and the size of the polishing pad. The mold of mold insert 600 may be a single mold or a plurality of molds, which are fixed or removable and which have a fixed or a variable distance from axis 112 to vary an amount of centrifugal force experienced by the polymer during the casting process. The mold or molds of mold insert 600 form an outline of a CMP pad, and have a textured surface as discussed above in regard to drum 110, insert 300, and/or internal insert 500. In some embodiments mold insert 600 has four molds on the sheet that lines drum 110, thus potentially producing four polishing pads in one casting. In this embodiment, polymer mixture 106 is poured into each mold individually, which eliminates the need to cut or punch out the polishing pad from a polymer sheet. Through this embodiment method, waste can be reduced.

Figure 7:
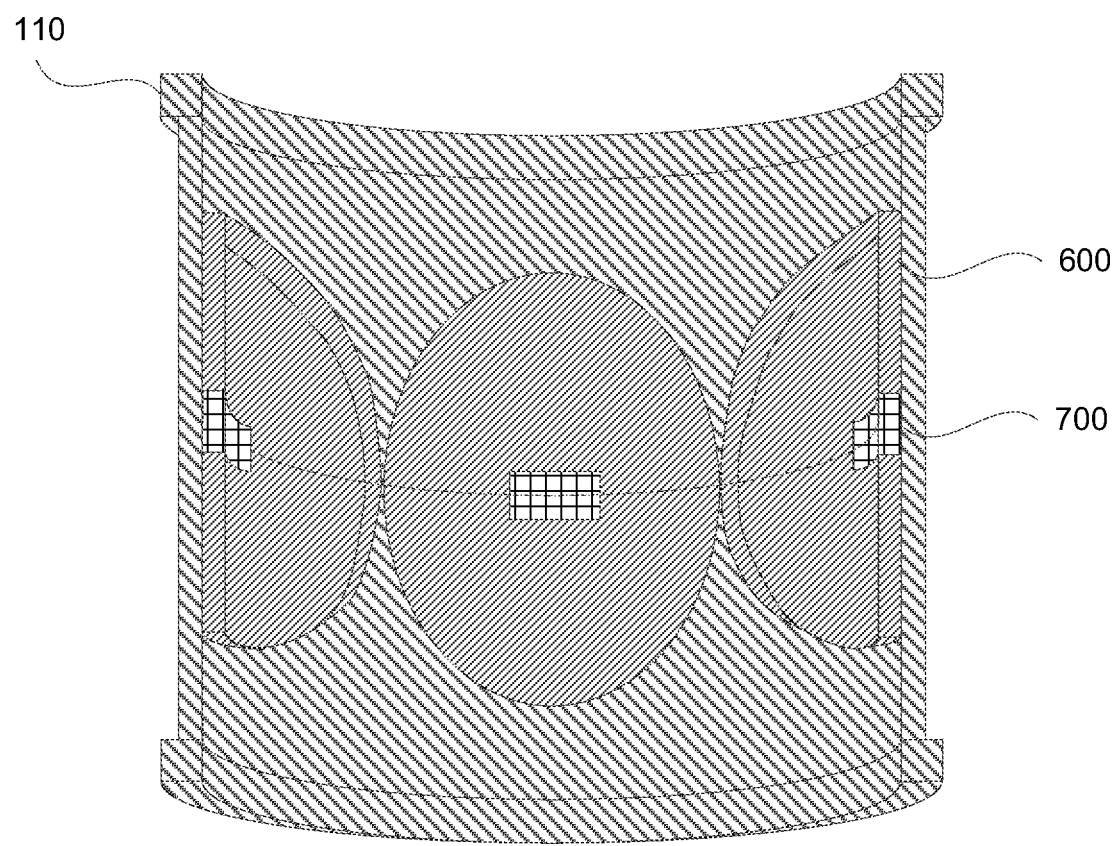
FIG. 7 is a schematic diagram illustrating a cross section of the example drum and showing an example mold insert and window, according to an example embodiment.

FIG. 7 is a schematic diagram illustrating a cross section of drum 110 and showing mold insert 600 and window 700. Window 700 is a transparent material (e.g., urethane) that enables the implementation of optical endpoint technology. Window 700 is placed in the molds of mold insert 600 before the polymer mixture is channeled into the individual molds. The polymer mixture surrounds the sides of window 700. When the polishing pad is removed from the mold, window 700 can either be incorporated into the polishing pad as a window, or be separated from the polishing pad to leave a space for a window to be inserted into the polishing pad.

Figure 8:
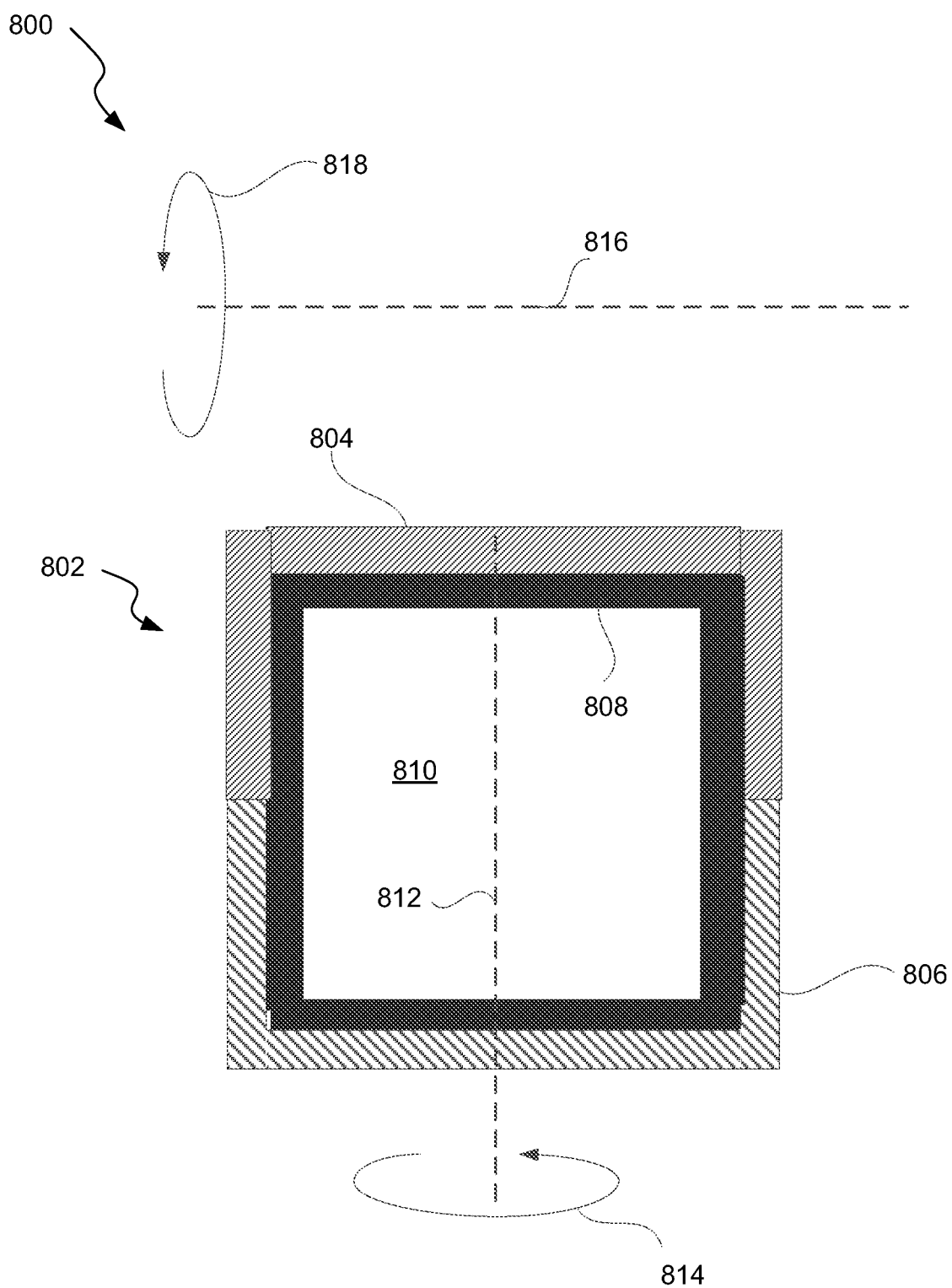
FIG. 8 is a schematic diagram illustrating an example rotational casting system including an example centrifugal caster, according to an example embodiment.

FIG. 8 is a schematic diagram illustrating multi-axis rotational casting system 800 including casting mold 802. Casting mold 802 includes two mold sections: top mold part 804 and bottom mold part 806. Top and bottom are used herein for reference purposes only, and not to limit the exemplary embodiments. Therefore, top mold part 804 could be positioned in a bottom area, and bottom mold part 806 could be positioned in a top area. Polymer mixture 808 is dispensed into one or both of top mold part 804 and bottom mold part 806 while separated, and then top mold part 804 and bottom mold part 806 is joined as shown in FIG. 8. Interior space 810 of casting mold 802 may include an air space, or alternatively is completely filled with polymer mixture 808. Top mold part 804 and bottom mold part 806 are sealed together prior to casting to form casting mold 802. Casting mold 802 is rotated around axis 812 in direction 814 and around axis 816 in direction 818. Axis 812 is shown bisecting casting mold 802, but alternatively is offset. Likewise, axis 816 is shown offset from casting mold 802, but alternatively bisects casting mold 802. One or both of the rotations is conducted initially and at a slower rate in order to promote coverage of the interior surface of casting mold 802. In still further alternatives, a vibration in one or more directions is used additionally or alternatively to promote wetting of the mold surface. One or both of the rotations is at a higher rotational velocity in order to promote the movement of microspheres toward an inner surface and/or to promote flatness on an interior surface of casting mold 802. Casting mold forms a cylindrical shape or any other appropriate shape. Casting mold 802 may be heated and has a smooth interior drum face, or alternatively has a textured drum face that improves the performance of adhesives used in the polishing pad, that provides grooves to a surface of a polish pad made according to the method, and/or that facilitates the separation and/or forming of a polish pad from a reacted and casted polymer sheet formed by the method.

Figure 9:
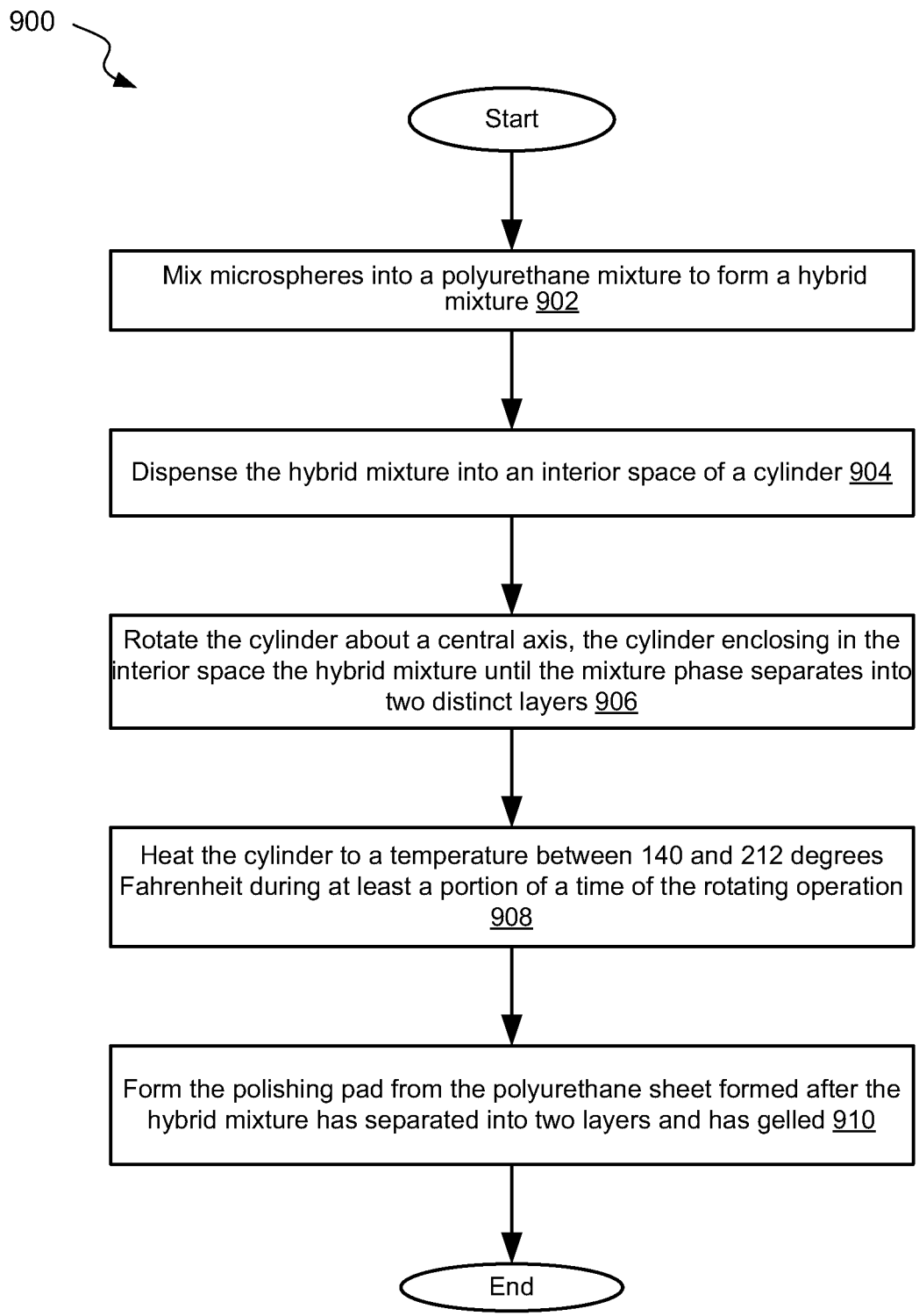
FIG. 9 is a flow chart illustrating an example method for making a multilayer polishing pad, according to an example embodiment.

FIG. 9 is a process flow diagram showing a method 900 according to the present technology using polyurethane. However, the method is also applicable to other polymers, as discussed herein. As shown in FIG. 9, the method 900 commences at operation 902, which indicates to mix microspheres into a polyurethane mixture to form a hybrid mixture. From operation 902, the flow proceeds to operation 904, which indicates to dispense the hybrid mixture into an interior space of a cylinder. From operation 904, the flow proceeds to operation 906, which indicates to rotate the cylinder about a central axis, the cylinder enclosing in the interior space the hybrid mixture until the mixture phase separates into two distinct layers. From operation 906, the flow proceeds to operation 908, which indicates to heat the cylinder to a temperature between 140 and 212 degrees Fahrenheit during at least a portion of a time of the rotating operation. From operation 908, the flow proceeds to operation 910, which indicates to form the polishing pad from the polyurethane sheet formed after the hybrid mixture has separated into two layers and has reacted. The process flow ends after operation 910.

A polymer (for example a polyurethane, also referred to as PU) casting system involves mixing more than one polymer together forming a polymer composite. To form the polymer composite, foam is added in between to separate the different polymer mixtures formed using a centrifugal caster.

Figure 10:
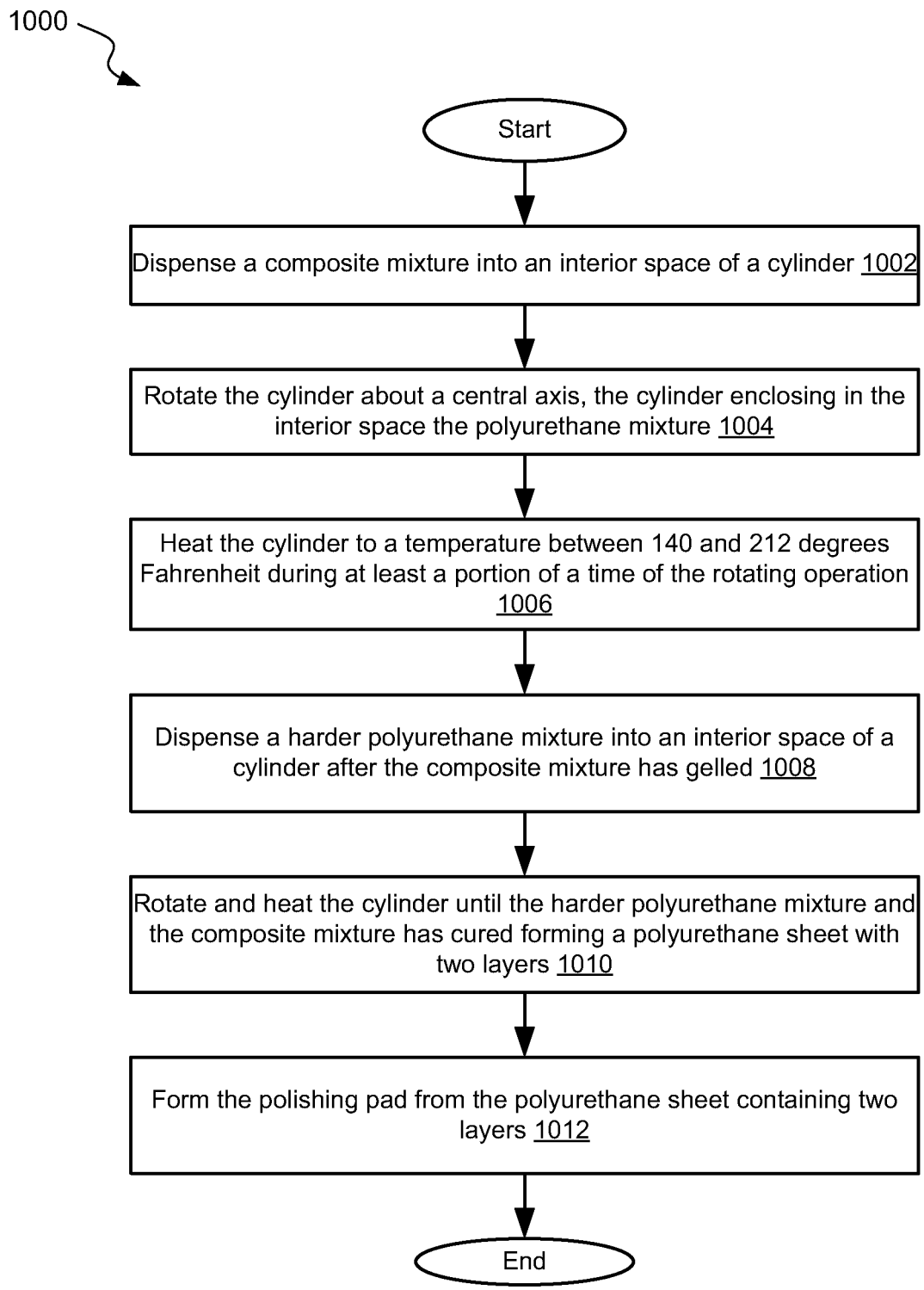
FIG. 10 is a flow chart illustrating an alternative example method for making a multilayer polishing pad, according to an example embodiment.

FIG. 10 process flow diagram showing an alternative method 1000 in forming multilayer polishing pads according to the present technology using polyurethane. However, the method is also applicable to other polymers, as discussed herein. As shown in FIG. 10, the method 1000 may commence at operation 1002, which indicates to dispense a composite mixture into an interior space of a cylinder. From operation 1002, the flow proceeds to operation 1004, which indicates to rotate the cylinder about a central axis, the cylinder enclosing in the interior space the composite mixture. From operation 1004, the flow proceeds to operation 1006, which indicates to heat the cylinder to a temperature between 140 and 212 degrees Fahrenheit during at least a portion of a time of the rotating operation. From operation 1006, the flow proceeds to operation 1008, which indicates to dispense a harder polyurethane mixture into an interior space of a cylinder after the composite mixture has gelled. From operation 1008, the flow proceeds to operation 1010, which indicates to rotate and heat the cylinder until the harder polyurethane and the composite mixture has reacted forming a polyurethane sheet with two layers. With the composite mixture solidified into a gel (also referred to as reacted), prior to dispensing the harder polyurethane, the harder polyurethane layer would chemically bond with the softer polyurethane layer without the need for pressure sensitive adhesive (PSA) to bind the two layers. From operation 1010, the flow proceeds to operation 1012, which indicates to form the polishing pad from the polyurethane sheet containing the two layers. The process flow ends after operation 1012.

In another embodiment, the harder polyurethane mixture is dispensed into the cylinder and gels before dispensing the composite mixture into the cylinder.

In further embodiments, prior to pouring the composite mixture into the cylinder, a thin layer is installed or formed on the surface of the softer polyurethane layer. The thin layer is made from polyester, textile, or conductive material. Alternatively, the thin layer of polyester, nylon, textile, or conductive material, is woven or non-woven, and can be on either side or encapsulate the polyurethane sheet. In further embodiments, the conductive material also coats (e.g., liquid, sprayed, or aerosolized) the polyurethane sheet prior to forming the polishing pad. In this alternative method, a multi-layer polymer pad is formed in a single or multiple castings.

The above description is illustrative and not restrictive. Many variations of the disclosure will become apparent to those of skill in the art upon review of this disclosure. The scope of the disclosure should, therefore, be determined not with reference to the above description, but instead should be determined with reference to the appended claims along with their full scope of equivalents.

What is claimed is:

1. A method for making a multilayer chemical mechanical planarization pad using centrifugal casting, the method comprising:

multi-axis and multi-directional rotational centrifugal casting a first polymer mixture comprising at least a polymer compound and a plurality of microspheres by rotating a cylindrical mold insert with at least one outline of a chemical mechanical planarization pad containing a window in a drum about a central axis and a second axis, the multi-axis and the multi-directional rotational centrifugal casting comprising rotating the cylindrical mold insert in the drum about the central axis in a first direction and about the second axis in a second direction, the rotating the cylindrical mold insert in the drum about the first direction being at a higher rotational velocity than the rotating the cylindrical mold insert in the drum about the second axis in the second direction;

separating the first polymer mixture under an influence of a centrifugal force from the multi-axis and the multi-directional rotational centrifugal casting into a solid, non-porous first layer comprising only the polymer compound and containing no microspheres and being free of voids or pores and being substantially uniform thickness and a second layer comprising the plurality of microspheres;

forming a multilayer polymer sheet via gelling of the first polymer mixture;

introducing a second polymer mixture into the cylindrical mold insert in the drum after the first polymer mixture has gelled and before the first polymer mixture has cured;

further multi-axis and multi-directional rotational centrifugal casting the second polymer mixture by rotating the cylindrical mold insert in the drum about the central axis;

removing the multilayer polymer sheet from the cylindrical mold insert; and
shaping a plurality of multilayer chemical mechanical planarization pads from the polymer sheet;
wherein the window enables optical endpoint technology.

2. The method of claim 1, wherein the plurality of microspheres enclose a gas.

3. The method of claim 1, wherein:
the second polymer mixture comprises at least a high density material and a low density material; and
the second polymer mixture separates under the influence of the centrifugal force during the further multi-axis and multi-directional rotational centrifugal casting into a third layer comprising the high density material and a fourth layer comprising the low density material, the third layer being interposed between the second layer and the fourth layer.

4. The method of claim 3, wherein the low density material comprises microspheres, the microspheres enclosing a gas.

5. The method of claim 1, further comprising, before introducing the second polymer mixture into the cylindrical mold insert, positioning a solid insert on a surface of the second layer, the solid insert being at least one of polyester, textile, and conductive material.

6. The method of claim 1, further comprising, before introducing the second polymer mixture into the cylindrical mold insert, spraying a liquid onto a surface of the second layer, the liquid being at least one of an adhesive and a conductive layer.

7. The method of claim 1, wherein the cylindrical mold insert and drum form a centrifugal caster adapted to rotate, the centrifugal caster defining a cylindrical interior space, and a dispenser being adapted to introduce the first polymer mixture into the mold insert of the centrifugal caster.

8. The method of claim 1, wherein the method further comprises heating the cylindrical mold insert during at least a portion of a time of the rotating, the heating of the cylindrical mold insert being to a temperature between 140 and 212 degrees Fahrenheit.

9. The method of claim 1, further comprising treating a surface of the cylindrical mold insert with a mold release agent prior to dispensing the first polymer mixture into the cylindrical mold insert.

10. The method of claim 1, further comprising forming a texture on at least one of a surface of the cylindrical mold insert, and a top liner positioned on a surface of the first polymer mixture, the texture adapted to form a perforation delineating an outer edge of the multilayer chemical mechanical planarization pad.

11. The method of claim 1, further comprising positioning another window on a surface of the cylindrical mold insert prior to introducing the polymer mixture into the cylindrical mold.

12. The method of claim 1, wherein the plurality of microspheres comprising the second layer are compressible.

13. A system for manufacturing a multilayer chemical mechanical planarization pad using centrifugal casting, the system comprising:
a plurality of polymer mixtures comprising at least a high density and a low density material wherein the polymer mixtures do not phase separate under ambient conditions;
a multi-axis and multi-directional rotational centrifugal caster configured for multi-axis and multi-directional rotational centrifugal casting, the multi-axis and the multi-directional rotational centrifugal casting comprising rotating a cylindrical mold insert in a drum about a central axis and a second axis in a first direction and in a second direction respectively, the rotating the cylindrical mold insert in the drum about the central axis in the first direction being at a higher rotational velocity than the rotating the cylindrical mold insert in the drum about the second axis in the second direction;
wherein the multi-axis and multi-directional rotational centrifugal caster comprises:
a drum with an interior wall; and
a mold insert with at least one outline of a chemical mechanical planaraization pad containing a window lining the interior wall of the drum, the mold insert adapted to confine the polymer mixture when the mold insert is rotating, the mold insert comprising channels for forming different types of chemical mechanical planarization pads and to improve slurry flow to ensure the presence of slurry on all areas of the multilayer chemical mechanical planarization pad;
wherein the window enables optical endpoint technology;
a dispenser exterior to the mold insert adapted to introduce the plurality of polymer mixtures into the mold insert;
a pouring path that directs the plurality of polymer mixtures introduced by the dispenser exterior to the mold insert into an interior of the mold insert.

14. The system of claim 13, wherein:
the central axis is a central axis of a cylinder defined by the centrifugal caster; and
the dispenser is adapted to introduce the plurality of polymer mixtures into an interior space of the centrifugal caster.

15. The system of claim 14, further comprising:
a mandrel insertable along the central axis, the mandrel being for positioning a solid insert on a surface of a top layer of the plurality of polymer mixtures in the interior space, and
the solid insert comprising at least one of polyester, textile, conductive material, and a top liner for imparting a texture to a surface of the polymer mixture, wherein the mold insert is slowed to a lower rotational velocity and the mandrel is rotated at the same rotational velocity, wherein the rotational velocity of the mold insert is subsequently increased to produce a centrifugal force pulling the solid insert from the mandrel.

16. The system of claim 13, further comprising a sprayer for spraying a liquid into the interior of the mold insert, the liquid being at least one of a mold release agent, an adhesive, and a conductive layer.

17. The system of claim 13, further comprising a heater for heating the mold insert during at least a portion of a time of the rotating and gelling of the plurality of polymer mixtures.

18. The system of claim 13, wherein the mold insert comprises a texture on a surface of the mold insert, the texture adapted to form at least one of:
a perforation delineating an outer edge of the multilayer chemical mechanical planarization pad; and
a roughened texture on a backside of a pad surface opposite the working surface to improve adhesion between the pad surface and at least one of an adhesive and a sub-pad.

19. The system of claim 13, wherein the mold insert is adapted to receive another detachable window on a surface of the mold insert prior to introducing the plurality of polymer mixtures into the mold insert, the detachable window adapted to be integrated into a multilayer chemical mechanical planarization pad formed from the plurality of polymer mixtures after gelling.

20. A method for making a multilayer chemical mechanical planarization pad using multi-axis and multi-directional rotational centrifugal casting, comprising:
   dispensing a polymer mixture comprising at least a polymer compound and a plurality of microspheres into a mold insert with at least one outline of a chemical mechanical planarization pad containing a window;
   sealing the mold insert such that the mold insert confines the polymer mixture;
   multi-axis and mufti-directional rotational centrifugal casting of the polymer mixture by rotating the mold insert about a plurality of axes segmenting the mold insert, the mufti-axis and the multi-directional rotational centrifugal casting comprising rotating the mold with the window about a central axis and a second axis in a first direction and in a second direction, the rotating the mold insert about the central axis in the first direction being at a higher rotational velocity than the rotating the mold insert about the second axis in the second direction;
   separating the polymer mixture under an influence of a centrifugal force of the multi-axis and the multi-directional rotational centrifugal casting into a solid, non-porous first layer comprising only the polymer compound and no microspheres and being free of voids or pores and being substantially uniform thickness and a second layer comprising the plurality of microspheres;
   forming a multilayer polymer sheet via gelling of the polymer mixture;
   removing the multilayer polymer sheet from the mold insert; and
   shaping a plurality of multilayer chemical mechanical planarization pads from the polymer sheet;
   wherein the window enables optical endpoint technology.

21. The method of claim 20, wherein the plurality of microspheres enclose a gas.

22. The method of claim 20, wherein the central axis is perpendicular to the second axis.

23. The method of claim 20, wherein the plurality of axes bisect the mold.

24. The method of claim 20, wherein the mold is vibrated to coat an interior surface of the mold with the polymer mixture.